US007882472B2

(12) United States Patent
Sardino et al.

(10) Patent No.: US 7,882,472 B2
(45) Date of Patent: Feb. 1, 2011

(54) METHOD, APPARATUS, AND COMPUTER PROGRAM PRODUCT FOR AUTOMATICALLY WAIVING NON-COMPUTE INDICATIONS FOR A TIMING ANALYSIS PROCESS

(75) Inventors: Nicholas P. Sardino, Hyde Park, NY (US); Sean M. Carey, Hyde Park, NY (US); Christopher M. Carney, Red Hook, NY (US); Vern Anthony Victoria, Wapplngers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 529 days.

(21) Appl. No.: 11/871,179

(22) Filed: Oct. 12, 2007

(65) Prior Publication Data

US 2009/0100394 A1   Apr. 16, 2009

(51) Int. Cl.
*G06F 17/50* (2006.01)

(52) U.S. Cl. .................................. 716/6; 716/4; 716/5

(58) Field of Classification Search ............... 716/4, 716/5, 6
See application file for complete search history.

(56) References Cited

U.S. PATENT DOCUMENTS

| 5,452,239 | A  | * | 9/1995 | Dai et al. .................. 703/19 |
| 6,418,551 | B1 |   | 7/2002 | McKay |
| 6,434,723 | B1 |   | 8/2002 | McBride |
| 2005/0188336 | A1 | | 8/2005 | Mortensen |

\* cited by examiner

*Primary Examiner*—Sun J Lin
(74) *Attorney, Agent, or Firm*—William A. Kinnaman, Jr.

(57) ABSTRACT

In the course of unit timing, there exists the possibility for a non-compute (N/C) on a particular net in an IC chip design, which could be caused by numerous things, including but not limited to a pin being tied to power, a floating output, or invalid timing test for a given phase at a test point. A process automatically verifies that all non-computes are understood and exist for valid reasons, in order to ensure all necessary paths are being timed. The process takes a conventional Comprehensive Report output of a unit timing run and generates macro specific N/C reports for designers to review and sign off on.

20 Claims, 3 Drawing Sheets

METHOD, APPARATUS, AND COMPUTER PROGRAM PRODUCT FOR AUTOMATICALLY WAIVING NON-COMPUTE INDICATIONS FOR A TIMING ANALYSIS PROCESS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

The present invention concerns an integrated circuit ("IC") device having network paths, wherein some of the network paths have associated non-compute ("N/C") indications produced by a timing analysis run. More specifically, it concerns selecting, before a subsequent timing run, those N/C-indicated network paths in which circuitry is changed.

2. Description of Background

A timing analysis run for an IC chip design commonly designates many nets in the design as N/C's. Some N/C's are expected, while some are problems. Those that are problems must be fixed. Many of them, however, are OK. It may happen that they are OK for a variety of reasons. Sometimes the logic designer intentionally left an input tied off or an output disconnected, for example. In a large IC chip design, there may be many thousands of these N/C indications for a timing run. Sometimes there may be tens of thousands, or even hundreds of thousands of N/C's. Thus, in order to confirm whether all necessary paths were timed in the run, it is conventional to manually examine long lists of N/C's generated by the timing run and to manually separate N/C's that do exist for valid and understood reasons from ones that do not. This is, of course, problematic, because this manual process is both resource intensive and subject to error.

SUMMARY OF THE INVENTION

The shortcomings of the prior art are overcome and additional advantages are provided through the provision of a process that automatically performs a method. That is, the process automatically detects and acts upon certain types of N/C's reported in timing analysis runs for an IC chip. This includes a first type of N/C that the process detects responsive to a predetermined property of a timing analysis run. In particular, for an N/C associated with a pin of the IC chip the process automatically categorizes and reports the N/C as being of the first type, deemed to arise from the pin being either floating or tied to power. The process detects and reports the first type of N/C responsive to the timing analysis run reporting no associated phase for the N/C's pin.

In addition, a timing analysis report of the run includes lines for respective nets, where the lines include corresponding pin names, net names, and timing information. The timing report also includes headers indicating macros and instances for groups of lines. The process produces a second report by reformatting the timing analysis report, wherein for macro and instance indications set out as group headers of the timing analysis report the macro and instance indications are set out on respectively corresponding net/pin lines of the second report.

In another aspect, responsive to detecting that valid data is asserted during one phase on a pin for an instance, the process selects N/C's on other phases for that instance and pin and acts to filter out the selected N/C's. For example, a report of N/C's generated responsive to the selection either leaves out the selected N/C's or identifies them distinctively or lists them in a separate report, which may be conveyed to a user.

In another aspect, the process generates an output file wherein N/C's from the second report are eliminated responsive to user specified N/C's, the user specification of N/C's being defined in a first waiver file.

In another aspect, the process incorporates a second waiver file in the first waiver file responsive to a user defined waiver incorporation statement in the first waiver file.

In another aspect, the process generates an output file wherein noncomputes from the second report are eliminated responsive to user specified noncomputes, the user specification of the noncomputes being defined in an argument passed to the process.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution in which macro specific N/C reports are generated automatically by a process that executes responsive to a conventional output report from a unit timing run, so that designers are not required to look through the conventionally report by hand and sign off each N/C individually.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

In the following detailed description of the preferred embodiments, reference is made to the accompanying drawings illustrating embodiments in which the invention may be practiced. It should be understood that other embodiments may be utilized and changes may be made without departing from the scope of the present invention. The drawings and detailed description are not intended to limit the invention to the particular form disclosed. On the contrary, the intention is to cover all modifications, equivalents and alternatives falling within the spirit and scope of the present invention as defined by the appended claims. Headings herein are not intended to limit the subject matter in any way.

The process or processes described herein may be implemented by logic in the form of instructions executing on a computer system (also referred to as a "data processing system"), or entirely in the form of hardware, or in an embodiment containing both hardware and software elements. Application specific integrated circuitry is another example of hardware.

Figure 1:
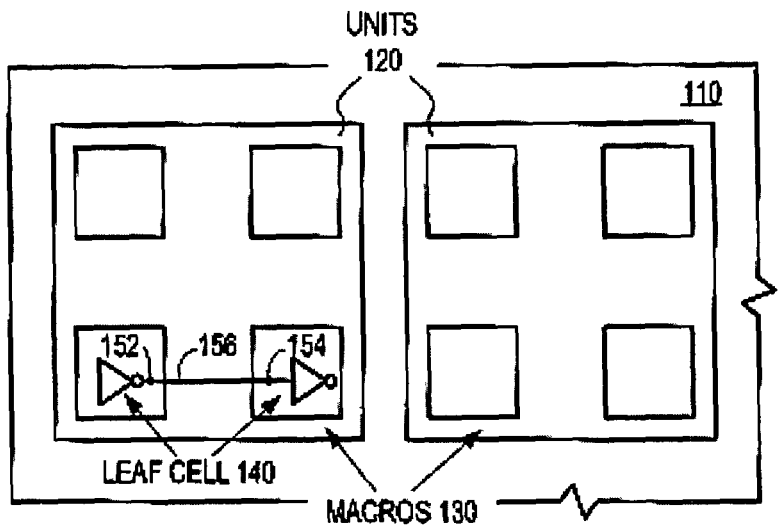
FIG. 1 illustrates features regarding reports, according to an embodiment of the present invention.

Turning now to the drawings in greater detail, it will be seen that in FIG. 1 there is shown a chip 110, according to the prior art. Regarding the use of the term "instance" herein, it is helpful to understand the following context. An embodiment of the present invention is applicable to hierarchical chip 110 designs. Generally speaking, hierarchical designs include a hierarchy of entities, such as chip 110, unit 120, macro 130, and leaf cell 140 entities, where the chip 110 is often at the highest level in the hierarchy. The entities are placeable objects and, in turn, may contain placeable objects. An embodiment of the present invention is also applicable to flat designs in which all placeable objects are at a common level or in which there is no hierarchy. In this context, "macros placed at the chip level," for example, refers to macros that are all at the same level in the hierarchy, where that level is the same as the level of the chip entity.

A buffer is an example of a placeable object. A buffer is often times a leaf cell, such as leaf cell 140 in the illustrated instance. A buffer master may be selected from a library and numerous instances placed in the chip in various locations. Accordingly, each instance of the buffer is assigned a unique instance name. Likewise, numerous instances of other entities can also be placed and given respective instance names. As previously described, N/C's may arise, for example, because some of the buffer instances are connected and driving things, while others aren't.

Regarding the use of the term "phase" herein, this refers to a feature in an embodiment of IC chip 110 of the present invention, wherein data is produced and propagated in different timing phases. That is, the placeable objects are clocked and propagation time from latch to latch is governed by the clock cycle time. Each data propagation from latch point A to latch point B has to be less than the clock period. "Phase" indicates what frequency data is timed at and in which context it's used. Timing analysis involves comparing data propagation time and clock pulse width to determine slack, which indicates propagation time that is either less than or greater than the clock frequency. It is an objective of timing analysts to check all the propagation delays to make sure they fall within the cycle time. If they don't, adjustments are made.

A net 156, as the term is used herein, includes a connection between an output pin 152 and input pin 154, i.e., a physical wire.

Unit Comprehensive Timing Report

Figure 2:
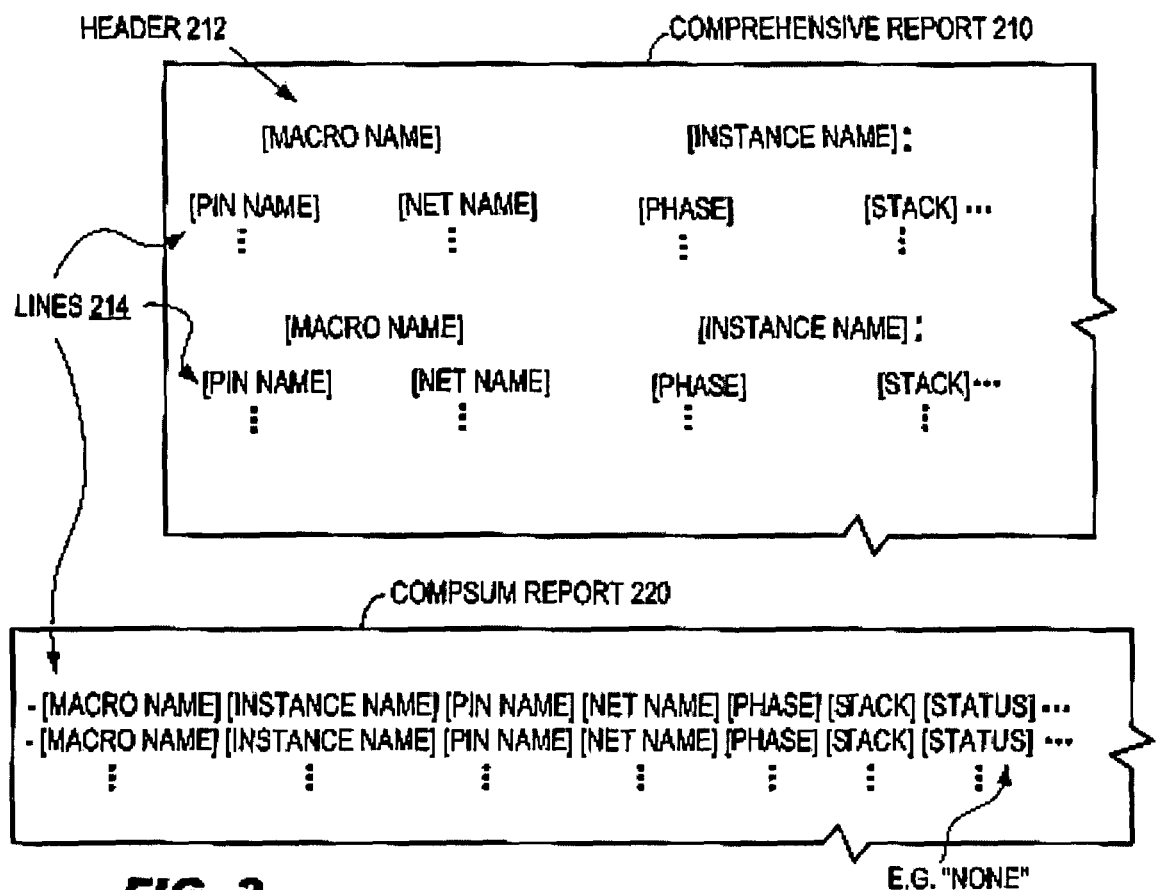
FIG. 2 illustrates a process of verifying N/C's, according to an embodiment of the present invention.
Figure 3:
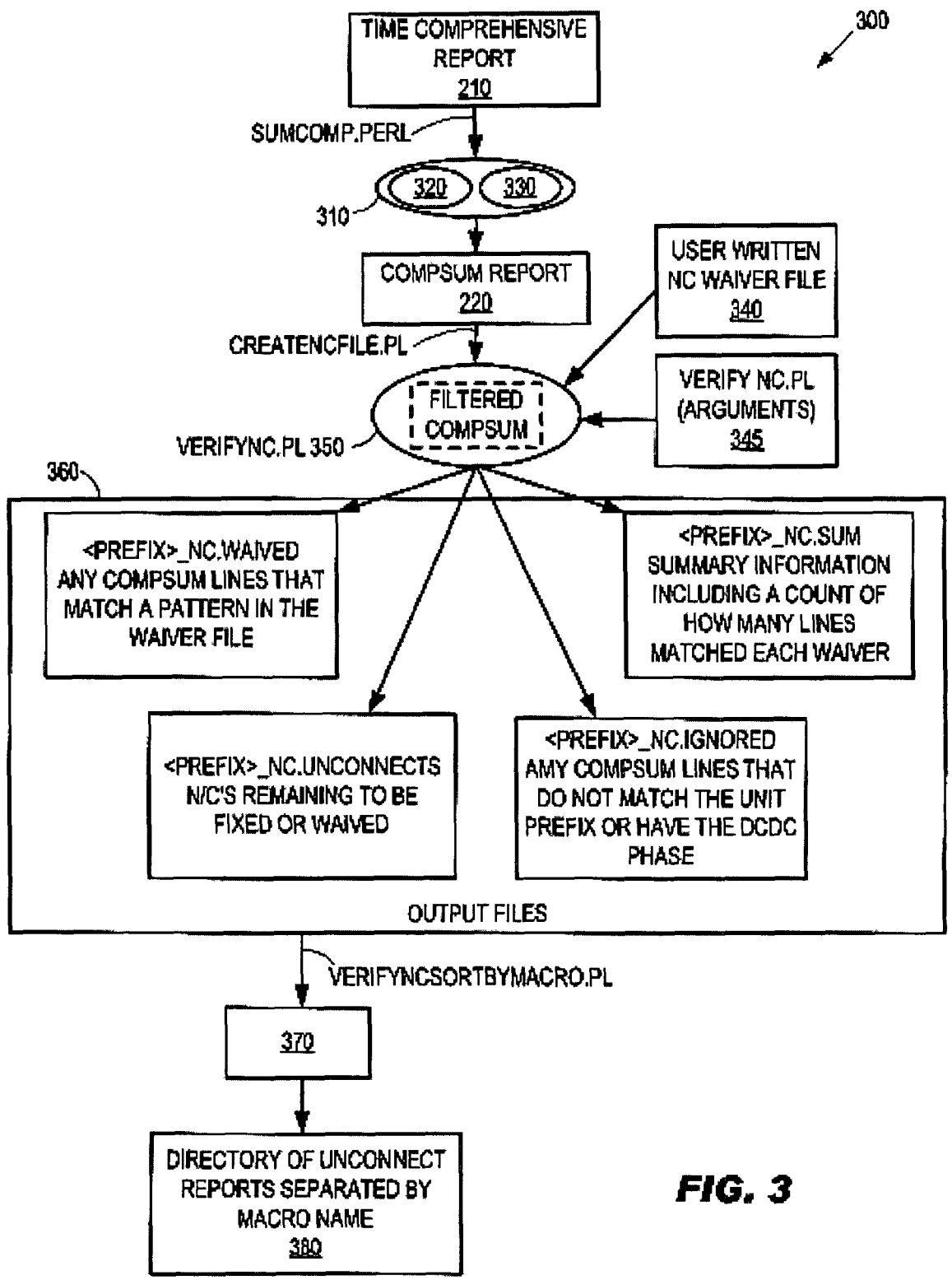
FIG. 3 illustrates a process of receiving a unit comprehensive report, according to an embodiment of the present invention.

Referring now to FIGS. 2 and 3, after initialization, an overall process 300 and structure are shown in FIG. 3, in which a process 310 receives a conventional unit comprehensive report 210 of FIG. 2, which is well-known in the art and has been generated from a conventional unit timing run. Comprehensive report 210 contains detailed information about arrival times, slews, and slacks for every instance/pin/phase combination in chip 110 design. Comprehensive report 210 can be generated for an entire hierarchy, or for any particular level of hierarchy of chip 110 (FIG. 1).

Generation of a "Compsum" Report (sumcomp.pl)

A compsum report 220 is produced by reformatting of a full comprehensive report 210. Key things to note are that in compsum report 220 instance and macro names are now listed on respective lines 214 with the pin name, net name, and timing information. Header 212 information that used to show the macro and instance full comprehensive report 210 is removed, i.e., relocated, in compsum report 220. That is, conventional full comprehensive report 210 includes lines 214 for respective nets, where lines 214 include corresponding pin names, net names, and timing information, and includes headers 212 indicating macros and instances for groups of lines. Process 310 reformats full comprehensive report 210 to produce compsum report 220, which includes removing macro and instances from group headers 212 and setting them out on respectively corresponding net/pin lines 214.

In addition, process 310 inserts the keyword "NONE" in compsum report 220 on lines 214 corresponding to pins having no associated phase listed. That is process 310 includes subprocess 320 logic for automatically detecting a pin that may be floating or tied to power by detecting that there is no associated phase listed for the pin in comprehensive report 220. Responsively, subprocess logic 320 sets out the keyword "NONE" in compsum report 220 on the lines corresponding to that pin. Alternatively, subprocess logic 320 sets out the keyword "NONE" in compsum report 220 for pins that are floating, "NONE_H" for pins tied high, and "NONE_L" for pins that are tied low. In this manner, the N/C indication for this pin in comprehensive report 210 is supplemented in compsum report 220.

Filtering of the Compsum for Expected N/C's (createNCfile.pl)

Sometimes multiple phases get propagated to macro outputs in timing runs. For example, a macro output that is driven by a latch "data_out" pin may assert valid data for both a data phase (M@L) and a scan phase ("B@L"). A latch that receives this data from the macro output may not have a valid setup test for the B@L phase. Consequently, the timing analysis run will properly calculate a valid slack for the M@L phase, for which the receiving latch does have a valid setup test, but the timing run will designate an N/C state for the B@L phase. This lack of valid setup test and resulting N/C indication is generally due to chip 110 having a predetermined, known logic feature, according to which the state of the receiving latch has no significance during the B@L phase. In an embodiment of the present invention, this situation is recognized by process 310. That is, subprocess logic 330 of process 310 detects at least one valid phase for an instance/pin combination. Responsive to detecting that valid data is asserted during one phase on a pin for an instance, the subprocess logic 330 "filters out" any N/C's on other phases for that instance/pin combination. That is, logic 330 generates a filtered compsum report having no N/C indication lines for an instance/pin combination, which may be stored in memory. In an alternative, this filtered compsum report may be conveyed to a user, such as by displaying, printing, or as a data structure stored on a portable, computer readable storage media.

The User Supplied Waiver File

According to an embodiment of the present invention, a user is responsible for creating a waiver file 340 specifying instance/macro/pin/phase combinations that are expected and can be waived. (This may also include a plurality of users respectively creating waiver files 340.) Process 350 includes logic for processing waiver file or files 340. In an embodiment, the format of waiver file 340 includes the following:

"#" denotes the start of a comment line.

"<instance_name> <macro_name> <pin_name> <phase>" denotes an instance/macro/pin/phase combination that is expected and can be waived. That is, process 350 recognizes a line in waiver file 340 with these parameters as a designation of waiver of the specified N/C.

"NET <net_name> <phase>" denotes waiver of all N/C's associated with the specified net_name and phase. That is, process 350 recognizes a line in waiver file 340 as a designation of waiver of the set of specified N/C's.

A '*' character denotes a wildcard. Bus notation is also supported, for example, data_in(0:63). That is, process XXX recognizes the meaning of this terminology in waiver file 340. Process 350 supports basic wildcarding and bus notation.

Wildcards permit granularity to waive categories of instances. For example, if a numerous instances of a buffer are included as spares in chip 110, where each one is given a name according to a predetermined format "sparebuffer_[instance number], the terminology "sparebuffer_*" can be used to waive all instances of these buffers.

The Waiver Process (verifyNC.pl)

N/C waiver process 350 reads in user's waiver file 340 and applies it to compsum report 220 and responsively generates output files 360. To initiate this, process 350 receives arguments 345, including a first argument specifying compsum report 220, a second argument specifying waiver file or files 340, and a third argument specifying a prefix to put on names of output files 360. Process 350 may also receive two optional arguments, a unit prefix for filtering, which will be discussed later, and a user specified directory for output files 360, which is self-explanatory.

Process 350 reads these arguments 345 from a file, verifyNC.pl, in which they are set out as follows:

verifyNC.pl <compsum> <waiver_file> <file_prefix> [-p <unit_prefix> -o <output_directory>]

Process 350, which may execute in the form of a script, reads the full compsum report 220 given by the user in the <compsum> argument and automatically runs filtering process 350 code, createNCfile.pl. Process 350 responsively creates the following four output files 350:

<file_prefix>.NC.waived—List of pins that were waived from <compsum>. Preceding each line is the pattern that matched for debug purposes.

<file_prefix>.NC.ignored—List of nets that were ignored either because they did not match <unit_prefix> or were the DCDC phases. ("DCDC" refers to a net that doesn't switch, and is, therefore, insignificant for timing analysis purposes. Over time it has a relatively constant value, such as a gating signal for which the designer doesn't care about arrival time. AC is something that's switching, DC is constant over time. A lot of times DC is tied off. Generally all "DC's" are ignored for timing analysis.)

<file_prefix>.NC.unconnects—List of any nets left over after all waivers have been applied. Whatever appears in this list either needs to be fixed in VHDL, have a physical design change, or needs to have a waiver written for it.

<file_prefix>.verifyNC.sum—Summary information including a count of each line that matched each waiver in the waiver file.

As previously mentioned, the user can specify a unit prefix by optional argument (-p <unit_prefix>).—If this is specified, process 350 will only check instances that match this prefix. In a sense, including this argument yields the opposite of a waiver file 340 by indicating which instances to check instead of which instances not to check. This is especially helpful for units that are flat at the chip 110 level. For example, on chip 110, if there's a flat unit LX having all macro instance names with an "LX" prefix, a unit timing coordinator for the unit LX may wish to evaluate a timing run comprehensive report 210 for which he/she doesn't care about any other macros besides those in unit LX. In this case, the timing coordinator may initiate execution of process 350 by a command that includes a "-p LX" argument Sorting the Results (verifyNCsortByMacro.pl)

When process 350 has completed its processing of waiver file(s) 340 and comprehensive report 220, it will have eliminated some N/C's and some will remain and will be listed in the "unconnects" file, as described herein above. Process 370 may then be used to automatically sort the remaining N/C's listed in the "unconnects" file thereby producing a sorted directory 380 that lists all reports of N/C's. In an embodiment of the invention, process 370 sorts the remaining N/C by macro, in order to facilitate dividing the remaining N/C's into respective subreports (or portions of a report) setting out respective macro's N/C's, and wherein process 370 presents the subreports or portions to teams or individuals who are responsible for respective ones of the macros.

Handling Hierarchy

In structuring the format of waiver files 340, special considerations were made for handling unit hierarchy so that waiver files 340 don't have to be redundant or duplicated. That is, any waiver file 340 can specify inclusion of another existing waiver file 340, thereby effectively including the other existing waiver file 340, by utilizing the following waiver file incorporation statement:

FILE <FileName> [<Prefix>]

This statement will cause process 350 to include the waiver file that is given by FileName, and will cause process 350 to append Prefix to the front of each line given in that file.

Consider the following example, in which the CHIP 110, which may be considered a parent entity, contains the following child entities below it in the entity hierarchy:

2 instances of L2C named 120 and 121

Each instance of L2C has a respective child entity called l2a 4 instances of LQ named lq0c, lq1e, lq0o, and lq1o A flat unit called LX A flat unit called IO A flat unit called TP In one instance, for example, waiver file 340 for CHIP 110 includes the following lines:

FILE/data/l2c_waiver_file l20
FILE/data/l2c_waiver_file l21
FILE/data/lq_waiver_file lq0e
FILE/data/lq_waiver_file lq1e
FILE/data/lq_waiver_file lq0o
FILE/data/lq_waiver_file lq1e
FILE/data/lx_waiver_file
FILE/data/io_waiver_file
FILE/data/tp_waiver_file In this instance, process 350 responsively incorporates all the waiver files 340 for all the entities of chip 110.

In another instance, for example, waiver file 340 for L2C includes the following lines:

FILE/data/l2a_waiver_file l2a

In this instance, process 350 responsively incorporates only the waiver files 340 for the entities of entity L2C.

A big advantage of this implementation is that unit timing coordinators can run waiver process 350 for their own units 120 on their own unit timing compsum reports 220. Then, when the chip timing coordinator runs the waiver process 350 for the entire chip 110, he/she can simply specify inclusion of all the child unit 120 waiver files 340 instead of copying each one of them into the chip timing coordinator's own waiver file 340.

A chip 110 level timing coordinator also has the ability to check only top level N/C's by writing a top level only comprehensive report 210 instead of a full hierarchical report. It is an advantageous feature of an embodiment of the present invention that if the chip timing coordinator checks only the top level entity by running process 350 with a waiver file 340 that specifies waivers of all nets below those of the top level entity or entities, and each unit timer checks his/her own box unit in similar fashion, i.e., by running process 350 on respective compsum reports 220 with respective waiver files 340 that specify waivers of all nets below those of the respective unit entities, then when process 350 checks the full chip 110 in a run on a fully hierarchical compsum report 220, it follows that if the individual checks produced clean results in which there are no unexpected N/C's, the full chip 110 check should be clean as well.

In other words, according to an embodiment of the invention the chip timing coordinator checks only placeable objects, i.e., instances, that exist flat at the chip 110 level (which could be other units and flat macros), but has no visibility into deeper levels of hierarchy. Nevertheless, if each unit timing coordinator has run a timing analysis achieving clean results on their own respective units (at the level below the chip entity), this achieves the same clean result as if the chip timing coordinator had run waiver process 300 with a full hierarchical compsum report.

Computer Program Product

The present invention, aspects of which are shown in the above FIG's, may be distributed in the form of instructions, which may include data structures and may be referred to as a "computer program," "program," "program code," "software," "computer software," "resident software," "firmware," "microcode," etc. Stored on a computer-readable storage medium, such instructions and storage medium may be referred to as a "computer program product," "program product," etc.

The computer program product may be accessible from a computer-readable storage medium providing program code for use by or in connection with a computer or any instruction execution system. The present invention applies equally regardless of the particular type of media actually used to carry out the distribution. The instructions are read from the computer-readable storage medium by an electronic, magnetic, optical, electromagnetic or infrared signal. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. The instructions may also be distributed by digital and analog communications links, referred to as "transmission media."

Computer System

A data processing system suitable for storing and/or executing program code includes at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
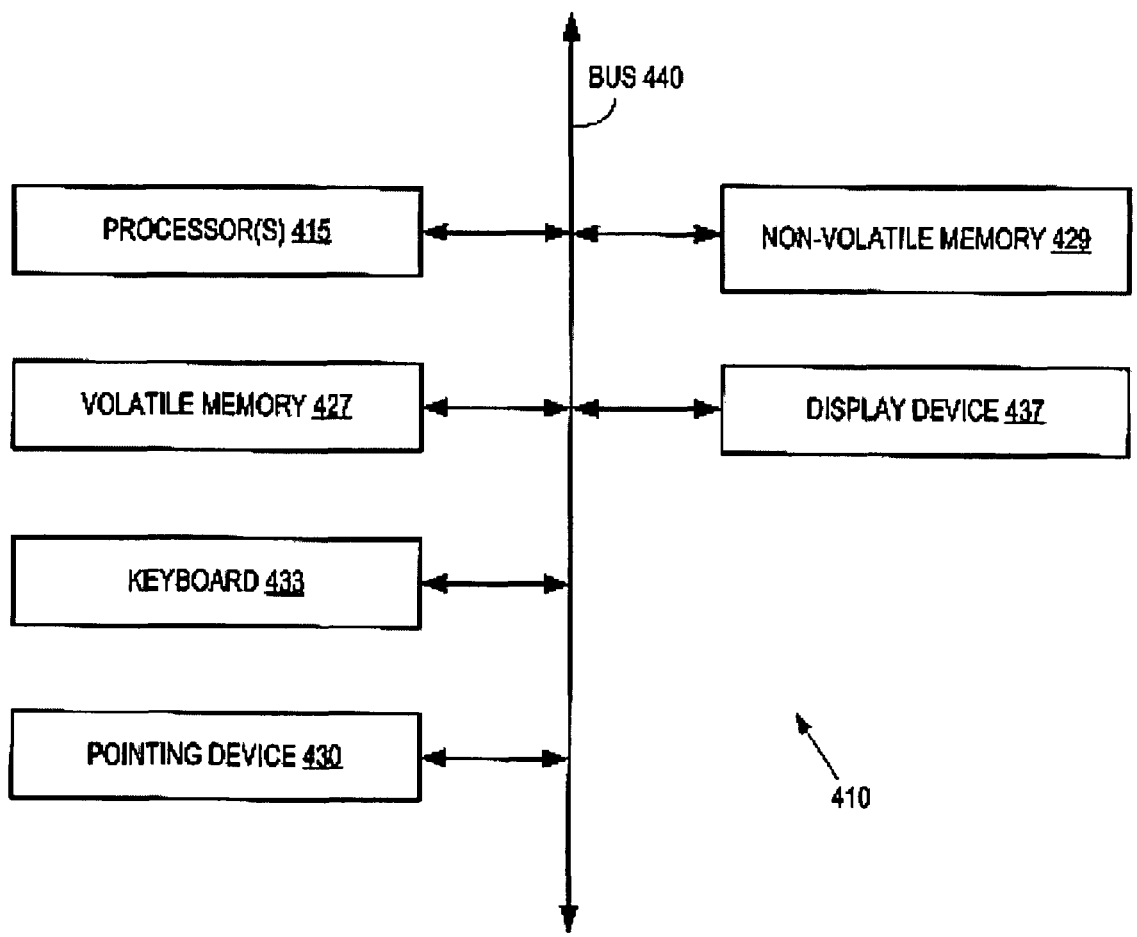
FIG. 4 illustrates one example of a computer system for implementation of a process such as that of FIG. 3, according to an embodiment of the present invention.

Referring now to FIG. 4, a computer system 410 is illustrated, which may take a variety of forms, including a personal computer system, mainframe computer system, workstation, server, etc. That is, it should be understood that the term "computer system" is intended to encompass any device having a processor that executes instructions from a memory medium. In the illustrated system embodiment, system 410 includes one or more processors 415, a keyboard 433, a pointing device 430, and tangible, computer-readable storage media, including volatile memory 427, and nonvolatile memory 429, e.g., ROM, hard disk, floppy disk, CD-ROM, and DVD, and display device 437.

Memory 429 of system 410 stores computer programs (also known as "software programs"), wherein programs include instructions that are executable by one or more processors 415 to implement various embodiments of a method in accordance with the present invention. Memory 429 of system 410 also has data stored thereon that provides circuit structures, logical entity properties including physical locations, etc. Programs include instructions for implementing processes described herein above, as well as other processes.

Those of ordinary skill in the art will appreciate that the hardware in FIG. 4 may vary depending on the implementation. For example, other peripheral devices may be used in addition to or in place of the hardware depicted in FIG. 4. The depicted example is not meant to imply architectural limitations with respect to the present invention. Various embodiments of system 410 implement one or more software programs and data in various ways, including procedure-based techniques, component-based techniques, and/or object-oriented techniques, among others. Specific examples include XML, C, C++ objects, Java and commercial class libraries.

General Remarks

The terms "circuitry" and "memory" and the like are used herein. It should be understood that these terms refer to circuitry that is part of the design for an integrated circuit chip 110 of FIG. 1. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

Unless clearly and explicitly stated, the claims that follow are not intended to imply any particular sequence of actions. The inclusion of labels, such as a), b), c) etc., for portions of the claims does not, by itself, imply any particular sequence, but rather is merely to facilitate reference to the portions.

The capabilities of the present invention can be implemented in software, firmware, hardware or some combination thereof. For example, processes described herein are implemented as Perl scripts in an embodiment of the invention.

To repeat, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately. Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Herein the terms "present" and "convey" are used, or variants thereof. It should be understood that these terms refer to delivering information to a user in a useful format, which may include displaying the information to the user on a computer system display, or printing information for the user. In some cases it may be useful to present information to a user as a data structure stored on a portable, computer readable storage media.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
   receiving a timing analysis report for an integrated circuit ("IC") device by a process of a computer system;
   detecting types of noncomputes reported in the timing analysis report, including detecting a first type of noncompute by a computer system process responsive to a predetermined property of the timing analysis report; and
   generating a second report by a computer system process, wherein the second report presents ones of the noncomputes of the timing analysis report, including presenting indications of types for the presented ones of the noncomputes.

2. The method of claim 1, wherein for a noncompute associated with a pin of the IC device, the detecting a first type of noncompute includes a computer system process detecting no associated phase for the noncompute's pin in the timing analysis report.

3. The method of claim 1, wherein the timing analysis report includes lines for respective nets, where the lines include corresponding pin names, net names, and timing information, and includes headers indicating macros and instances for groups of lines, and wherein the method includes:
   producing a second report by a computer system process automatically reformatting the timing analysis report, wherein for macro and instance indications set out as group headers of the timing analysis report, the reformatting includes setting out the macro and instance indications respectively on corresponding net/pin lines of the second report.

4. The method of claim 1, wherein responsive to detecting that the timing analysis report indicates valid data is asserted during one phase on a pin for an instance, a computer system process automatically filters out noncomputes on other phases for that instance and pin.

5. The method of claim 1, comprising:
   generating an output file wherein noncomputes from the second report are eliminated responsive to user specified noncomputes, which are defined in a first waiver file.

6. The method of claim 5, comprising:
   incorporating a second waiver file in the first waiver file by a computer system process responsive to a waiver incorporation statement in the first waiver file.

7. The method of claim 1, comprising:
   generating an output file wherein noncomputes from the second report are eliminated responsive to user specified noncomputes, which are defined in an argument passed to a computer system process.

8. A computer program product, stored on a computer readable medium, the computer program product having instructions for execution by a computer system, wherein the instructions, when executed by the computer system, cause the computer system to implement a method comprising steps of:
   receiving a timing analysis report for an integrated circuit ("IC") device by a process of a computer system;

detecting types of noncomputes reported in the timing analysis report, including detecting a first type of noncompute by a computer system process responsive to a predetermined property of the timing analysis report; and generating a second report by a computer system process, wherein the second report presents ones of the noncomputes of the timing analysis report, including presenting indications of types for the presented ones of the noncomputes.

9. The computer program product of claim 8, wherein for an noncompute associated with a pin of the IC device, the detecting a first type of noncompute includes a computer system process detecting no associated phase for the noncompute's pin in the timing analysis report.

10. The computer program product of claim 8, wherein the timing analysis report includes lines for respective nets, where the lines include corresponding pin names, net names, and timing information, and includes headers indicating macros and instances for groups of lines, and wherein the instructions, when executed by the computer, cause the method to further comprise a step of:

producing a second report by a computer system process automatically reformatting the timing analysis report, wherein for macro and instance indications set out as group headers of the timing analysis report, the reformatting includes setting out the macro and instance indications respectively on corresponding net/pin lines of the second report.

11. The computer program product of claim 8, wherein responsive to detecting that the timing analysis report indicates valid data is asserted during one phase on a pin for an instance, a computer system process automatically filters out noncomputes on other phases for that instance and pin.

12. The computer program product of claim 8, wherein the instructions, when executed by the computer system, cause the method to further comprise a step of:

generating an output file wherein noncomputes from the second report are eliminated responsive to user specified noncomputes, which are defined in a first waiver file.

13. The computer program product of claim 12, wherein the instructions, when executed by the computer system, cause the method to further comprise a step of:

incorporating a second waiver file in the first waiver file by a computer system process responsive to a waiver incorporation statement in the first waiver file.

14. The computer program product of claim 8, wherein the instructions, when executed by the computer system, cause the method to further comprise a step of:

generating an output file wherein noncomputes from the second report are eliminated responsive to user specified noncomputes, which are defined in an argument passed to a computer system process.

15. A computer system comprising:
a processor; and
a storage device connected to the processor, wherein the storage device has stored thereon a program for controlling the processor, and wherein the processor is operative to execute instructions of the program to implement a method comprising steps of:

receiving a timing analysis report for an integrated circuit ("IC") device by a process of the computer system;

detecting types of noncomputes reported in the timing analysis report, including detecting a first type of noncompute by a computer system process responsive to a predetermined property of the timing analysis report; and generating a second report by a computer system process, wherein the second report presents ones of the noncomputes of the timing analysis report, including presenting indications of types for the presented ones of the noncomputes.

16. The computer system of claim 15, wherein for an noncompute associated with a pin of the IC device, the detecting of a first type of noncompute includes a computer system process detecting no associated phase for the noncompute's pin in the timing analysis report.

17. The computer system of claim 15, wherein the timing analysis report includes lines for respective nets, where the lines include corresponding pin names, net names, and timing information, and includes headers indicating macros and instances for groups of lines, and wherein the method implemented by the processor executing instructions of the program further comprises a step of:

producing a second report by a computer system process automatically reformatting the timing analysis report, wherein for macro and instance indications set out as group headers of the timing analysis report, reformatting includes setting out the macro and instance indications respectively on corresponding net/pin lines of the second report.

18. The computer system of claim 15, wherein responsive to detecting that the timing analysis report indicates valid data is asserted during one phase on a pin for an instance, a computer system process automatically filters out noncomputes on other phases for that instance and pin.

19. The computer system of claim 15, wherein the method implemented by the processor executing instructions of the program further comprises a step of:

generating an output file wherein noncomputes from the second report are eliminated responsive to user specified noncomputes, which are defined in a first waiver file.

20. The computer system of claim 19, wherein the method implemented by the processor executing instructions of the program further comprises a step of:

incorporating a second waiver file in the first waiver file by a computer system process responsive to a waiver incorporation statement in the first waiver file.

* * * * *